US 6,622,907 B2

(12) United States Patent
Fanti et al.

(10) Patent No.: US 6,622,907 B2
(45) Date of Patent: Sep. 23, 2003

(54) SACRIFICIAL SEED LAYER PROCESS FOR FORMING C4 SOLDER BUMPS

(75) Inventors: Lisa A. Fanti, Hopewell Junction, NY (US); Randolph F. Knarr, Goldens Bridge, NY (US); Erik J. Roggeman, Fishkill, NY (US); Kamalesh K. Srivastava, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/078,948

(22) Filed: Feb. 19, 2002

(65) Prior Publication Data
US 2003/0155408 A1 Aug. 21, 2003

(51) Int. Cl.$^7$ .................. B23K 31/02; H01L 21/441; B44C 1/22
(52) U.S. Cl. .................. 228/215; 228/180.22; 228/245; 228/256; 438/613; 438/694; 216/18; 216/41
(58) Field of Search .................. 228/180.22, 245, 228/246, 214, 215, 254, 256; 257/737, 738; 438/613, 694, 614; 216/17, 18, 41

(56) References Cited

U.S. PATENT DOCUMENTS

| 5,268,072 A | * | 12/1993 | Agarwala et al. | 216/13 |
| 5,492,235 A | * | 2/1996 | Crafts et al. | 438/695 |
| 5,503,286 A | * | 4/1996 | Nye et al. | 216/13 |
| 5,543,032 A | | 8/1996 | Datta et al. | 205/670 |
| 5,629,564 A | * | 5/1997 | Nye et al. | 257/762 |
| 5,767,010 A | * | 6/1998 | Mis et al. | 438/617 |
| 5,800,726 A | | 9/1998 | Cotte et al. | 216/108 |
| 5,855,993 A | * | 1/1999 | Brady et al. | 428/209 |
| 5,885,891 A | | 3/1999 | Miyata et al. | 438/612 |
| 5,937,320 A | * | 8/1999 | Andricacos et al. | 438/614 |
| 6,162,652 A | * | 12/2000 | Dass et al. | 438/18 |
| 6,187,680 B1 | * | 2/2001 | Costrini et al. | 438/688 |
| 6,222,279 B1 | * | 4/2001 | Mis et al. | 257/779 |
| 6,277,669 B1 | * | 8/2001 | Kung et al. | 438/106 |
| 6,293,457 B1 | * | 9/2001 | Srivastava et al. | 228/254 |
| 6,319,846 B1 | * | 11/2001 | Lin et al. | 438/754 |
| 6,332,988 B1 | * | 12/2001 | Berger et al. | 216/100 |

(List continued on next page.)

FOREIGN PATENT DOCUMENTS

| DE | 197 16 044 A 1 | 4/1997 | ............ H05K/3/22 |
| JP | 3-137186 | 12/2001 | ........... C09K/11/06 |

Primary Examiner—Tom Dunn
Assistant Examiner—Kiley Stoner
(74) Attorney, Agent, or Firm—Graham S. Jones, II; Ira D. Blecker

(57) ABSTRACT

Start with a semiconductor substrate with contacts exposed through an insulating layer. Form a base over the contacts, with the base composed of at least one metal layer. Then form a conductive metal layer over the base. Form a mask over the top surface of the conductive metal layer with C4 solder bump openings therethrough with the shape of C4 solder bump images down to the surface of the conductive metal layer above the contacts. Etch away the exposed portions of the conductive metal layer below the C4 solder bump openings to form through holes in the conductive metal layer exposing C4 solder bump plating sites on the top surface of the base below the C4 solder bump openings with the conductive metal layer remaining intact on the periphery of the through holes at the C4 solder bump plating sites. As an option, form a barrier layer over the plating sites next. Form C4 solder bumps on the plating sites on the base/barrier layer within the C4 solder bump openings, with the C4 solder bumps being in contact with the conductive metal layer on the periphery of the through holes. Remove the mask. Etch away the remainder of the conductive metal layer, and etch away the base aside from the C4 solder bumps forming BLM pads. Then reflow the C4 solder bumps to form C4 solder balls.

20 Claims, 10 Drawing Sheets

U.S. PATENT DOCUMENTS 6,333,559 B1 * 12/2001 Costrini et al. ............. 257/762
6,358,836 B1 * 3/2002 Lu et al. ...................... 438/618
6,489,229 B1 * 12/2002 Sheridan et al. ............ 438/614
6,501,185 B1 * 12/2002 Chow et al. ................. 257/780
6,536,653 B2 * 3/2003 Wang et al. ........... 228/180.22
6,541,366 B1 * 4/2003 Chin et al. .................. 438/613
2002/0068425 A1 * 6/2002 Chen et al.
2002/0079576 A1 * 6/2002 Seshan
2002/0190028 A1 * 12/2002 Srivastava et al.
2003/0057551 A1 * 3/2003 Datta et al.

* cited by examiner

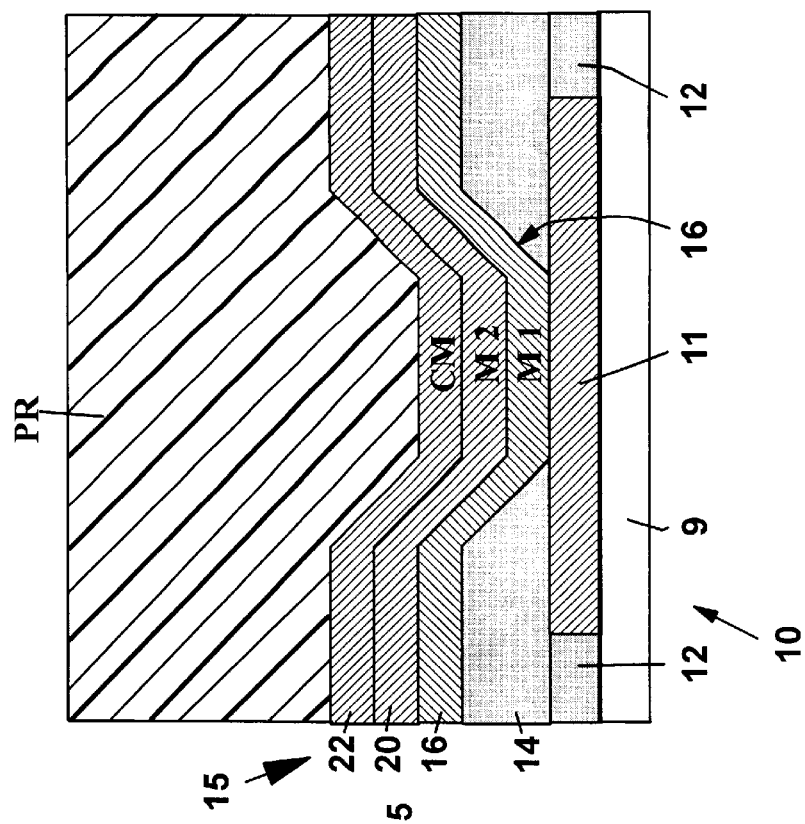
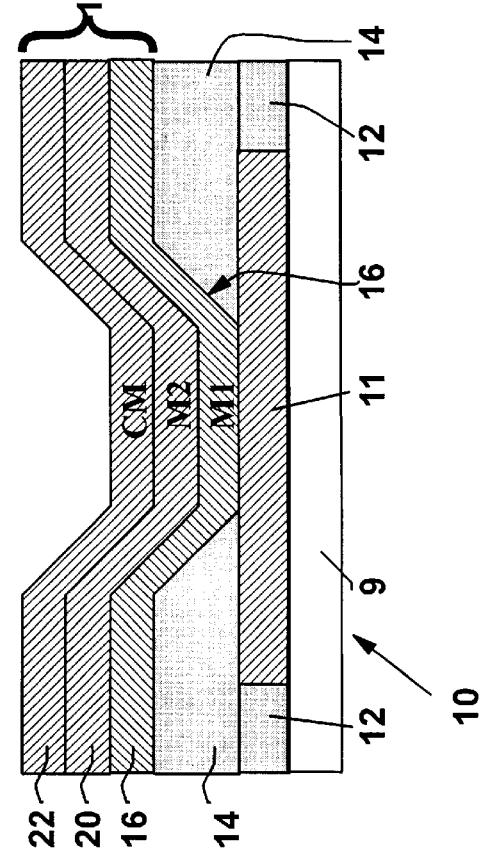
FIG. 3A
FIG. 3B

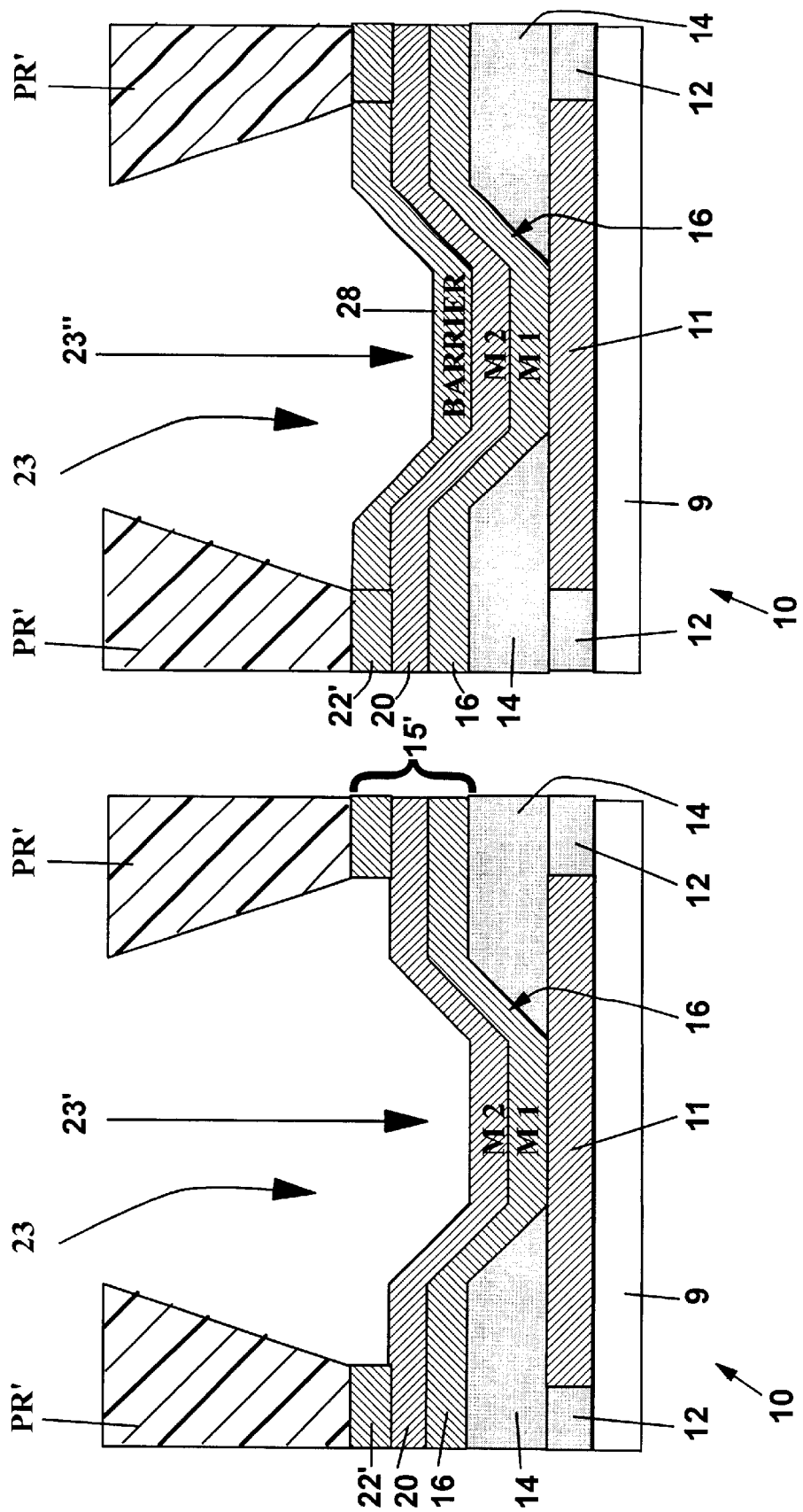

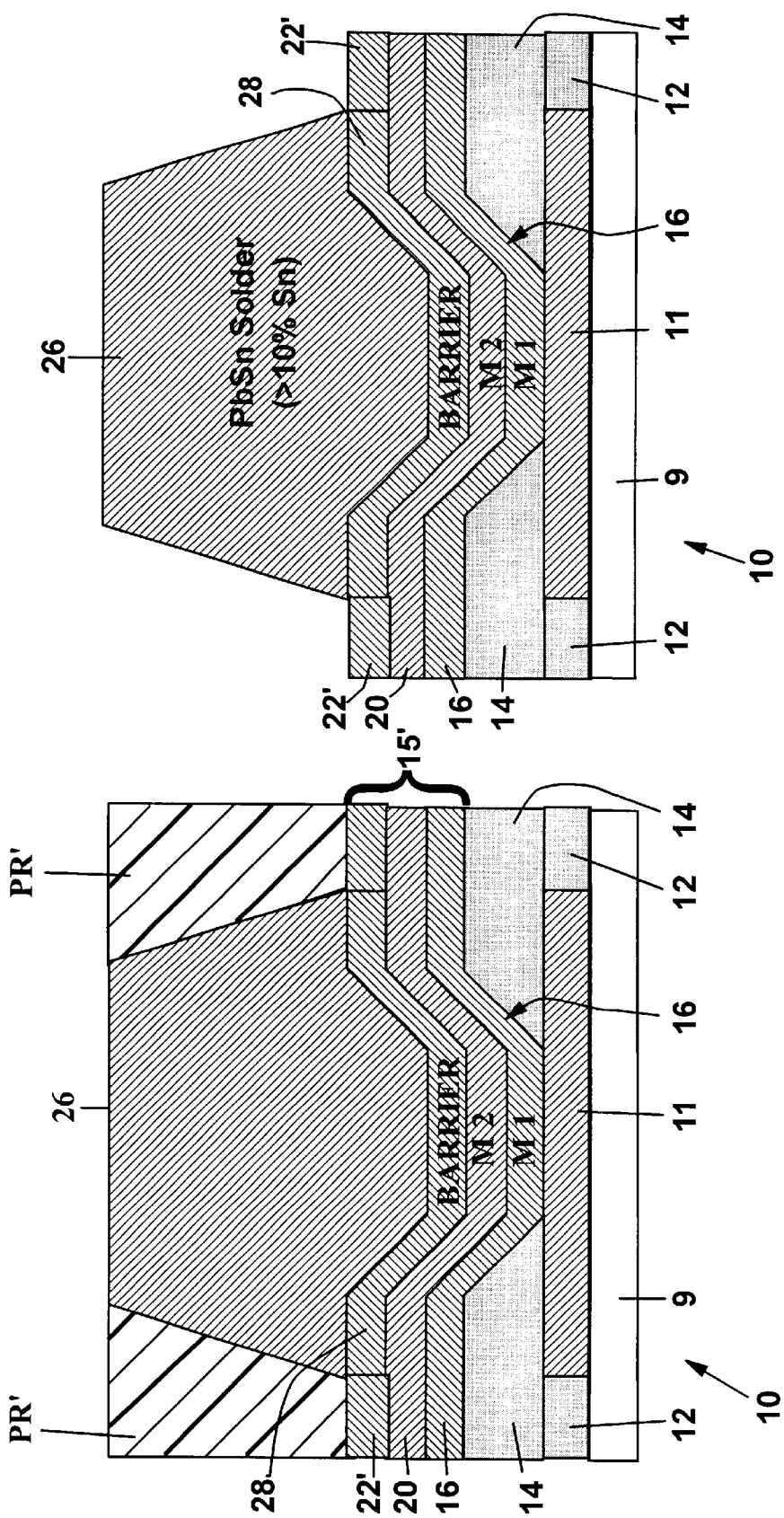

SACRIFICIAL SEED LAYER PROCESS FOR FORMING C4 SOLDER BUMPS

BACKGROUND OF THE INVENTION

1. Field of the Invention

This invention relates to processes for forming C4 solder bumps and more particularly to the metallurgy employed for enhanced characteristics of the joints.

2. Description of Related Art

Controlled Collapse Chip Connection (C4) solder ball, flip chip connections have been used for more than thirty years to provide flip chip interconnections between semiconductor devices and substrates. Cylindrical C4 solder bumps are formed above an insulation layer and above the exposed surfaces of connector pads each of which is exposed through a VIA hole in the insulation layers. Later the C4 solder bumps are heated above the melting point until the C4 solder bumps reflow by controlled collapse to form C4 solder balls. The actual C4 solder bumps may be fabricated using a number of different processing techniques, including evaporation, screening, and electroplating. Fabrication by electroplating requires a series of basic steps which typically include but are not limited to the deposition of a metallic seed layer on the top surface of the wafer final passivation layer, the application of an imaged photoresist (in the pattern of C4 solder bumps), the electrodeposition of solder, the stripping of the photoresist, and the subetching of the metallic seed layer to isolate the C4 bumps. The metallurgy which is chosen for the seed layer is crucial to both the fabrication process and the ultimate C4 structure.

The first fundamental operation in forming C4 solder bumps by electrolytic means is to deposit a continuous stack of metal films across the wafer to be bumped. The so-called "conductive metal" performs a dual function. First, it provides a conductive path for current flow during the electrolytic deposition of the C4 solder bumps. Second, the conductive metal remains under the C4 solder bumps and forms the basis for the Ball Limiting Metallurgy (BLM) underneath the C4 solder balls, which ultimately defines the field reliability of the device. Therefore, the BLM layers must include at least one layer that is conductive enough to permit uniform electrodeposition across the entire expanse of the wafer. The bottom layer must adhere well to the underlying passivation, and the top layer must interact sufficiently with the solder to form a reliable bond. In addition, the BLM may contain barrier layers which prevent the solder from detrimentally interacting with the underlying device constituents. Finally, the stresses generated by the composite seed layer stack should be low enough to sustain the reliability of C4 solder ball joints when exposed to various thermomechanical stresses. As a result, both the constituents and the thicknesses of the various BLM layers (i.e. barrier layer and seed layer metals) are carefully chosen to provide sufficient functionality under a wide variety of thermal, mechanical and environmental conditions.

Because of its relatively high conductivity, copper (Cu) is used frequently as an electroplating conductive metal. This method has proven successful for C4 solder bump applications, when including a layer of copper in the seed layer stack greater than 1000 Angstroms in thickness), provides adequate conductivity to electroplate C4 solder bumps uniformly across an entire 300 mm diameter wafer. In many cases, particularly those in which the C4 solder bumps contain a high percentage of lead (Pb) metal (greater than 90% Pb), the presence of copper in the BLM metal layers also satisfies the other objectives listed above. Upon heat treatment, lead-rich C4 solder bumps containing small amounts of tin beneficially react with the copper layer to form stable copper tin (Cu—Sn) intermetallic compounds that remain intact over a wide range of field conditions.

However, there are more recent applications in which it can actually be detrimental to include copper as a BLM constituent of the seed layer. Many semiconductor packages now utilize organic carriers, which cannot tolerate temperatures in excess of 240° C. In addition, many high performance semiconductor devices are now being designed with low K dielectric materials that become unstable at temperatures above 300° C. Finally, there is a strong market demand for lead-free solders, which are gradually being introduced as high-Sn composites. For these reasons, high-lead solder bumps that melt at temperatures greater than 300° C. are not universally applicable. As a result, C4 solder bumps which contain higher percentages of tin and melt at temperatures less than 220° C. are becoming industry standard.

High-Sn C4's are easily fabricated by electrodeposition, provided that a sufficiently conductive seed layer such as copper is employed. Unfortunately, the presence of copper in the final BLM structure does not necessarily produce a reliable structure. Upon heat treatment, copper reacts so aggressively in the presence of Sn-rich solder bumps that a BLM structure containing copper becomes unstable and deteriorates rapidly. One way to mitigate this effect is to utilize copper as a conductor, but protect it with a less reactive barrier layer, such as Ni. This solution does minimize exposure to BLM attack, but under extreme field conditions, the high-Sn solder has the potential to eventually attack the copper portion of the BLM from the periphery of the C4 solder balls. Completely removing copper from the seed layer is plausible, but renders it extremely difficult to electroplate C4 solder balls uniformly without a sufficiently conductive seed layer.

FIGS. 1A and 1B illustrate a prior art process for manufacturing one or more C4 solder bump(s) 24 and forming one or more C4 solder balls 30 therefrom on a conformal, seed layer stack 15 formed above a metal contact 11 formed on a semiconductor device 10. The seed layer stack 15 is composed of a base of at least one metal adhesion layer 16. As shown in FIGS. 1A and 1B the device 10 includes a base of two metal layers 16/20. To complete the seed layer stack, the metallic base layers 16/20 are covered by a conductive metal (CM) layer 22, that is composed of copper (Cu). A portion of the semiconductor device 10 is shown to illustrate an example of a C4 bumping process sequence in which the seed layer stack 15 is used during processing. As will be explained below, after processing only a portion of the copper originally included in CM layer 22 remains in CM layer 22N as a part of the seed layer stack 15 of layers 16N, 20N and 22N in FIG. 1B.

The device 10 on which the seed layer stack 15 and the C4 solder bump 24 are formed includes a lower insulator layer 12 in which the metal contact 11 has been formed. The metal contact 11 is partially covered by a second insulator layer 14 through which a tapered VIA hole has been formed exposing a portion of the top surface of the metal contact 11. The seed layer stack 15 is formed on the surfaces of the second insulator layer 14 and the exposed portion of the top surface of the metal contact 11. The C4 solder bump 24 is formed over the seed layer stack 15 in an opening formed in a photoresist mask PR'.

The series of process steps used to fabricate structures in FIGS. 1A and 1B begins with a partially formed device 10 which includes the planar contact 11 and the lower insulation layer 12, which have been formed on the surface a substrate 9, such as a silicon wafer (as shown) or a dielectric layer formed thereabove, as will be well understood by those skilled in the art. The contact and the lower insulation layer 12 are shown as having upper surfaces which are formed in a single plane. An upper insulation layer 14 is formed covering both a portion of the planar contact 11 and the lower insulation layer 12 with a tapered VIA hole opening through the upper insulation layer 14 exposing a portion of the top surface of the contact 11.

The processing sequence is as follows:

1. Deposit a multi-layer, conformal, seed layer stack 15 on the surface of insulator 14 and the exposed surface of metal contact layer 11. The seed layer stack 15 includes a conformal, lower metal (M1) adhesion layer 16 covering the upper dielectric layer and reaching down through the VIA hole to contact the portion of the top surface of contact 11 exposed by the VIA hole. A conformal, intermediate metal (M2) layer 20 is formed over the adhesion layer 16 which is covered, in turn, with a conformal conductive metal (CM) layer 22 on the surface of M2 layer 20 which is composed of a conductive metal, e.g. copper (Cu).
2. Deposit a thick-film of photoresist PR on top of the CM layer 22 of stack 15.
3. Expose and develop the photoresist PR to form a photoresist mask PR' forming the C4 solder bump images in the photoresist mask PR' defining the locations of the C4 solder bumps to be formed into the C4 solder balls 30 of FIG. 1B.
4. Electroplate the C4 solder bumps 24 which are usually high in lead (Pb) content.
5. Remove the photoresist mask PR' by chemical dissolution.
6. Remove the exposed, peripheral portions of the seed layer stack 15 including peripheral portions of the CM layer 22, the M2 layer 20 and M1 layer 16, aside from the C4 solder bumps 24 to form BLM pads 15N (shown in FIG. 1B) for shaping of the solder bump 26 into the solder ball 30 during the reflow step.

In other words in an array of C4 solder bumps 24, the peripheral portions of the seed layer stack 15 are removed from the surface of the insulator 14 between C4 solder bumps 24, by metal etching techniques leaving the narrowed layers 22N, 20N, and 16N of BLM pad 15N which are centered under the C4 solder bump 24.

7. Reflow the C4 solder bump(s) 24 to form the C4 solder ball(s) 30 shown in FIG. 1B on top of the surface copper/intermetallic CM layer 22N of the BLM pads 15N.

FIG. 1A illustrates the fully deposited device 10 prior to the removal of the photoresist mask PR' and the superfluous, peripheral portions of the CM layer 22 composed of copper (Cu), the M2 layer 20, and the M1 layer 16 aside from the C4 solder bump 24.

FIG. 1B depicts the final device 10 after the removal of the photoresist mask PR', removal of the peripheral portion of seed layer stack 15 leaving a narrower BLM pad 15N, and reflowing of the C4 solder bump 24 to form the C4 solder ball 30. Note that the removal of the peripheral portion of the seed layer stack 15 forms the narrower BLM pad 15N composed of copper CM layer 22N, M2 metal layer 20N and M1 metal adhesion layer 16N. In this traditional embodiment, the original underlying copper CM layer 22, between the reflowed C4 solder ball 30 and the intermediate M2 metal layer 20N, has been transformed into an acceptable BLM copper/tin intermetallic layer 22N (that includes both converted and unconverted copper) which remains as an integral part of the structure of the final BLM stack 15N, which produces highly reliable interconnects when the weight percentage of tin (Sn) remains low, i.e. less than ten percent (<10%) in the lead/tin C4 solder bump 24.

FIGS. 2A and 2B show the two steps illustrated by FIGS. 1A and 1B after substitution of a tin enriched C4 solder bump 26 containing high-tin (high-Sn) tin-lead solders, such as tin-lead (SnPb) eutectic (63% Sn/37% Pb) into the method of FIGS. 1A and 1B, which yields less robust interconnects. FIG. 2B depicts the final device 10 after the removal of the photoresist mask PR', which was followed by removal of the peripheral portion of the seed layer stack 15 and finally reflowing of the C4 solder bump 26 to form the C4 solder ball 30B. As in FIG. 1B, in FIG. 2B peripheral portions of the seed layer stack 15 have been removed therefrom to form BLM pads 15B for shaping of the solder bump 26 into the solder ball 30 during the reflow step. However in this case the ultimate result is that a shorter BLM pad 15B is formed during the sequence of steps in the process. As shown in FIG. 2B, the BLM pad 15B is composed of only the intermediate M2 layer 20B and the lower M1 layer 16B. The sharp difference is that in this case there is no remaining trace of the CM layer 22 on top of final BLM pad 15B. The copper in the CM layer 22 was consumed during the reflow process which formed the C4 solder ball 30B because of the presence of large amounts of tin (Sn). During the reflow process, the interaction between the copper and the tin at the interface between the C4 solder bump 26 and the CM layer 22 initially causes deterioration of the CM layer 22 as the copper is consumed when combining with the tin. Ultimately, the result is the consumption and the migration of the remainder of the copper in the CM layer 22 to form copper tin (CuSn) intermetallics 221 in the C4 solder ball 30B during completion of the process of formation thereof. This process eventually leads to voiding, i.e. formation of voids 22V, and the result is a highly resistive interface between the M2 layer 20B and the bulk of the C4 solder ball 30B.

In summary, in FIG. 2B the CM layer 22 of FIG. 2A which was composed of copper is absent because it has been completely absorbed in the C4 solder ball 30B leaving copper/tin (CuSn) intermetallic regions 221 and voids 22V which are located in the region of the C4 solder ball 30B between the intermetallic regions 221 and the intermediate M2 layer 20B producing the undesirable result of a highly resistive interface between the intermediate M2 layer 20B and the C4 solder ball 30B.

Commonly assigned U.S. Pat. No. 5,937,320 of Andricacos et al. for "Barrier Layers for Electroplated SnPb Electric Solder Joints" describes fabricating a C4 flip-chip structure with three BLM layers capped by an additional BLM barrier layer interfacing between the electroplated tin-rich C4 solder bump and a copper layer. The barrier layer is provided to protect the conductive metal layer (copper) from attack by the tin (Sn) in the lead-tin solder which is used to form the solder ball. The barrier layer is composed of nickel, iron, cobalt or alloys thereof. The preferred barrier layer is nickel which is electroplated through the same photoresist mask as the solder. The Andricacos et al. process requires an additional electroplating step to add the barrier layer which separates the copper from the tin-rich C4 solder bump. Changing plating baths adds complexity and an additional step in the bump plating process and requires intermediate steps of plating the barrier layer onto the workpiece for a timed interval, removal of the workpiece from the barrier layer bath, rinsing the workpiece and reinsertion of the workpiece into a C4 solder bump plating bath. Moreover, the resulting C4 bump is formed on an additional barrier layer above the other barrier layers. The thickness of the barrier layer adds a fourth layer on top of the three BLM layers with additional electrical resistance added to the layers providing the connection between the C4 solder ball and the contact below the various barrier layers.

U.S. Pat. No. 5,885,891 of Miyata et al for "Method of Manufacturing Semiconductor Device" provides a single BLM layer during the process of electroplating the solder bump composed of a thin layer of titanium which has been oxidized aside from a mask formed where the bump is to be formed. Then the mask is removed and the bump is plated without any photoresist onto the titanium which has been exposed by removal of the mask. The titanium is used as the cathode in an electroplating process. A problem with this procedure is that the titanium is a poor conductor and for a large device the current/resistance (IR) voltage drop will result in excessive variations in the thickness of the solder balls plated in the electroplating bath. The fact that the photoresist is absent results in a different geometry of C4 solder bump in the form of a mushroom with the disadvantage that mushrooms can cause formation of short circuits on reflow (melting). Also, mushrooming makes it difficult to control dimensional and compositional uniformity.

For background information, see German Offenlegunschrift DE 197 16 044 A 1 and Japan Patent Number 3-137186.

SUMMARY OF THE INVENTION

The present invention comprises a method for using a highly conductive metal layer such copper (Cu), gold (Au), silver (Ag) or platinum (Pt) as the key conductive component of the seed layers, but selectively removing it so it does not end up in the final structure.

The process of this invention can be implemented with one or more barrier layers to optimize C4 reliability.

In accordance with this invention, a method is provided for forming a solder structure on a substrate starting with contacts exposed through an insulating layer and forming a base over the contacts, with the base having a top surface and being composed of at least one metal layer. Form a conductive metal (CM) layer, with an upper surface, over the base. Form a mask over the top surface of the (CM) layer, with the mask having C4 solder bump openings therethrough in the shape of C4 solder bump images down to expose the CM layer above the contacts. Etch away the exposed portions of the CM layer below the C4 solder bump openings forming through holes, with sidewalls, on the CM layer down to the top surface of the base, thereby forming C4 solder bump plating sites on the top surface of the base, with the CM layer remaining intact aside from the through holes. Deposit solder over the base to form C4 solder bumps to fill the C4 solder bump plating sites in the C4 solder bump openings and through the sidewalls thereof plating solder into the solder bump openings. Remove the mask and etch away the remainder of the CM layer. Then etch away the base aside from the C4 solder bumps thereby forming BLM pads which are plated with the C4 solder bumps. Preferably, form the C4 solder bumps into C4 solder balls above the BLM pads, form an intermediate metal layer above the one metal layer before forming the CM layer, form an intermediate metal layer above the one metal layer before forming the CM layer, and reflow the C4 solder bumps to form C4 solder balls over the BLM pads. Preferably, perform the step of filling the C4 solder bump openings with a barrier layer over the base, after etching away the exposed portions of the CM layer below the C4 solder bump openings and before electroplating solder over the base to form C4 solder bumps. Preferably, deposit the C4 solder bumps by providing an electroplating current through the CM layer and through the sidewalls thereof to plate the solder in the solder bump openings with the C4 solder bumps being in contact with the CM layer on the periphery of the through holes by providing an electroplating current passing through the CM layer and through the sidewalls thereof to plate the solder in the solder bump openings. Preferably, form the CM layer with at least one of the metals selected from the group consisting of Cu, Au, Ag, and Pt; and form an intermediate layer of metal above the one metal layer before forming the CM layer.

In accordance with another aspect of this invention, form a solder ball on a substrate starting with contacts exposed through an insulating layer and forming a base over the contacts, with the base having a top surface and is composed of at least one metal layer. Form a CM layer with an upper surface over the base. Form a mask over the top surface of the CM layer with C4 solder bump openings therethrough in the form of windows in the shape of C4 solder bump images down to the surface of the CM layer above the contacts. Etch away the exposed portions of the CM layer below the C4 solder bump openings, thereby forming through holes, with sidewalls, in the CM layer exposing C4 solder bump plating sites on the top surface of the base below the C4 solder bump openings with the CM layer remaining intact on the periphery of the through holes at the C4 solder bump plating sites. Plate solder onto the top surface of the base at the C4 solder bump plating sites filling the C4 solder bump openings by providing an electroplating current through the CM layer and through the sidewalls thereof to plate the solder in the solder bump openings with the C4 solder bumps is in contact with the CM layer on the periphery of the through holes by providing an electroplating current passing through the CM layer and through the sidewalls thereof to plate the solder in the solder bump openings. Deposit solder over the base to form C4 solder bumps filling the C4 solder bump plating sites within the C4 solder bump openings and through the sidewalls thereof to plate the solder in the solder bump openings. Remove the mask. Then etch away the base aside from the C4 solder bumps thereby forming BLM pads which are plated with the C4 solder bumps. Preferably, reflow the C4 solder bumps to form a solder balls therefrom over the remaining base regions after the step of etching away the base aside from the C4 solder bumps leaving remaining base regions self-aligned with the C4 solder bumps; form another metal layer above the adhesion metal layer before forming the CM layer, form an intermediate layer above the adhesion metal layer before forming the CM layer, and reflow the C4 solder bumps to form a solder balls over the BLM pads. Preferably, the method includes depositing solder to form C4 solder bumps on the top surface of the base at the C4 solder bump plating sites filling the C4 solder bump openings by providing an electroplating current through the CM layer and through the sidewalls thereof to plate the solder in the solder bump openings with the C4 solder bumps is in contact with the CM layer on the periphery of the through holes by providing an electroplating current passing through the CM layer and through the sidewalls thereof to plate the solder in the solder bump openings. Preferably, the CM layer is formed by at least one of the metals selected from the group consisting of Cu, Au, Ag, and Pt.

In accordance with still another aspect of this invention, a method of forming a solder ball on a substrate starts with contacts exposed through an insulating layer and forming a base over the contacts, with the base having a top surface and is composed of at least one metal layer. Form a CM layer with a upper surface over the base. Form a mask over the top surface of the CM layer with C4 solder bump openings therethrough in the form of windows in the shape of C4 solder bump images down to the surface of the CM layer above the contacts. Etch away the exposed portions of the CM layer below the C4 solder bump openings, thereby forming through holes, with sidewalls, in the CM layer exposing C4 solder bump plating sites on the top surface of the base below the C4 solder bump openings with the CM layer remaining intact on the periphery of the through holes at the C4 solder bump plating sites. Deposit a barrier layer with a barrier surface over the top surface of the base. Plate solder onto he barrier surface at the C4 solder bump plating sites filling the C4 solder bump openings by providing an electroplating current through the CM layer and through the sidewalls thereof to plate the solder in the solder bump openings with the C4 solder bumps is in contact with the CM layer on the periphery of the through holes by providing an electroplating current passing through the CM layer and through the sidewalls thereof to plate the solder in the solder bump openings. Deposit solder over the base to form C4 solder bumps filling the C4 solder bump plating sites within the C4 solder bump openings and through the sidewalls thereof to plate the solder in the solder bump openings. Remove the mask. Then etch away the base aside from the C4 solder bumps thereby forming Ball Limiting Metallurgy (BLM) pads on which C4 solder bumps have been formed. Preferably, form the C4 solder bumps into C4 solder balls above the BLM pads. Preferably, the CM layer is formed by at least one of the metals selected from the group consisting of Cu, Au, Ag, and Pt, the adhesion layer is composed of a material selected from the group consisting of tungsten and titanium/tungsten (TiW), the intermediate layer is composed of CrCu, and the barrier layer is composed of a material selected from the group consisting of Ni, NiFe alloy, NiP alloy, Co, and CoP alloy. Preferably, include the step of depositing solder to form C4 solder bumps on the barrier surface of the barrier layer filling the C4 solder bump openings by providing an electroplating current through the CM layer and through the sidewalls thereof to plate the solder in the solder bump openings with the C4 solder bumps is in contact with the CM layer on the periphery of the through holes by providing an electroplating current passing through the CM layer and through the sidewalls thereof to plate the solder in the solder bump openings.

BRIEF DESCRIPTION OF THE DRAWINGS

The foregoing and other aspects and advantages of this invention are explained and described below with reference to the accompanying drawings, in which:

FIGS. 3A–3H illustrate the process steps of the first embodiment of the process of the current invention which is a modification of the process of FIGS. 2A and 2B with the copper conductive metal layer removed from the top of the seed layer stack beneath the C4 solder bump image prior to solder deposition and reflow thereof to form the C4 solder balls.

FIGS. 4A–4H illustrate a second embodiment of the process of this invention which is a modification of the process of FIGS. 3A–3B in which a barrier layer is added between an intermediate layer of the seed layer stack and the C4 solder bump.

DESCRIPTION OF THE PREFERRED EMBODIMENTS

First Preferred Embodiment

Figures 2A, 2B:
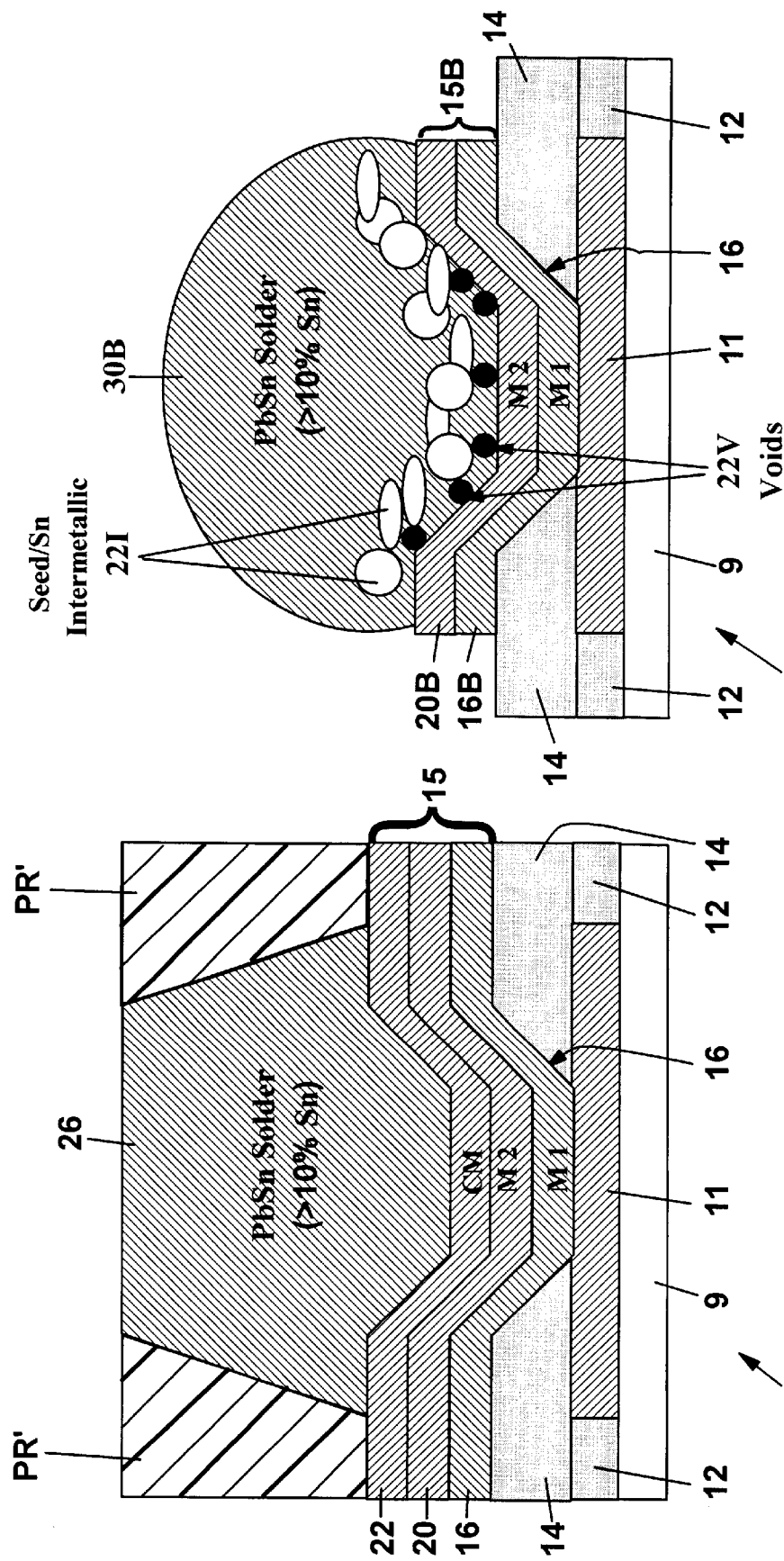
FIGS. 2A and 2B show a prior art process which is a modification of the process of FIGS. 1A and 1B after substitution of a tin enriched C4 solder bump containing high-tin, tin-lead solders, such as tin-lead eutectic into the method of FIGS. 1A and 1B, which yields less robust interconnects because of high reactivity between a copper conductive metal layer on the top surface of the seed layer stack and a high-tin, tin-lead solder when the C4 solder bumps are reflowed to form C4 solder balls.
Figures 3C, 3D:
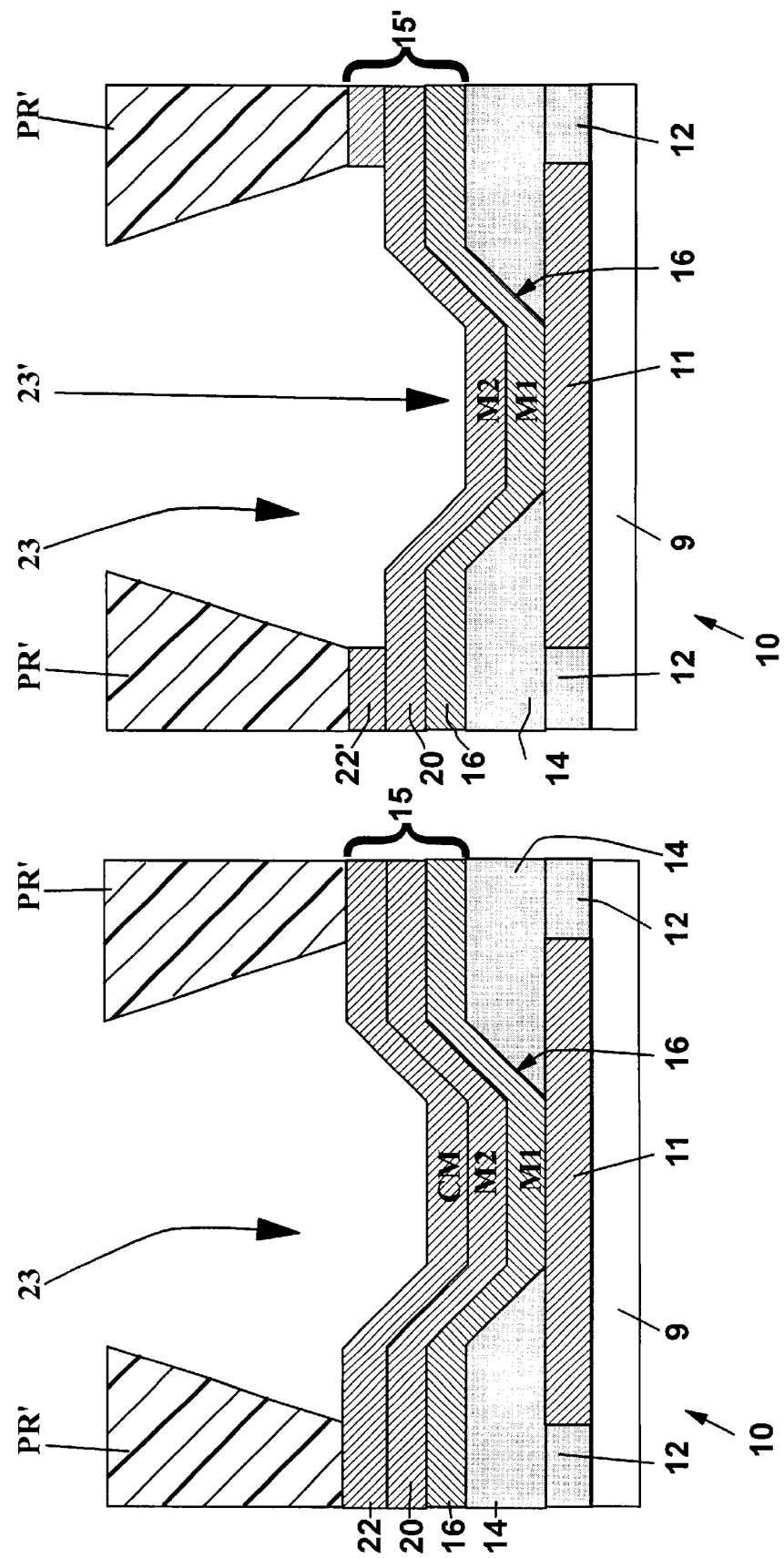

Referring to FIGS. 3A–3H, the process steps of first embodiment of the process of the current invention are illustrated. The process of FIGS. 3A–3H is a modification of the process of FIGS. 2A and 2B with like elements having like numbers on a modified version of the semiconductor device 10. As shown in FIGS. 3A–3C, in the early steps of the first embodiment of the process, the conductive metal (CM) layer 22 is shown initially covering the entire intermediate metallic, M2 layer 20 as in FIG. 2A. However, at the stage seen in FIG. 3D, much of the CM layer 22 has been etched away prior to the electrodeposition of the C4 solder bumps 26 in FIG. 3E. This alternative method still guarantees uniform deposition of the C4 solder bumps 26 across the entire expanse of the wafer because the electroplating current to each of the electroplating sites receives a substantially equal electropotential.

After the CM layer 22 has been partially etched away below the sites for the C4 solder bumps 26, this process leaves a continuous metallic surface formed by the remaining portion of the highly conductive CM layer 22 that surrounds the C4 solder bump image(s) formed by a window 23' in the photoresist mask PR' as seen in FIG. 3D. CM layer 22' is what remains of the CM layer 22 which provides an intact electrical conductor with sufficiently low electrical resistance to ensure that all locations of the C4 solder bumps 26 are held at substantially the same voltage during the electroplating process so that the C4 solder bumps 26 are well within acceptable parameters of equality of height and mass.

Referring to FIG. 3A, the modified process sequence of the first embodiment of the invention is performed on device 10. Once again, the semiconductor device 10 is formed on a substrate 9 which can be a silicon wafer, as shown, or can be a dielectric or the like, as will be well understood by those skilled in the art. A lower insulation layer 12 is formed on the surface of substrate 9. A planar electrical contact 11 is formed in an opening in the lower insulation layer 12. The electrical contact 11 and lower insulation layer 12 are shown as having coplanar upper surfaces. An upper insulation layer 14 covers the lower insulation layer 12 and a portion of the electrical contact 11. A tapered VIA opening is made through the upper insulation layer 14 which reaches through layer 14 down to the top surface of the electrical contact 11.

Figures 1A, 1B:
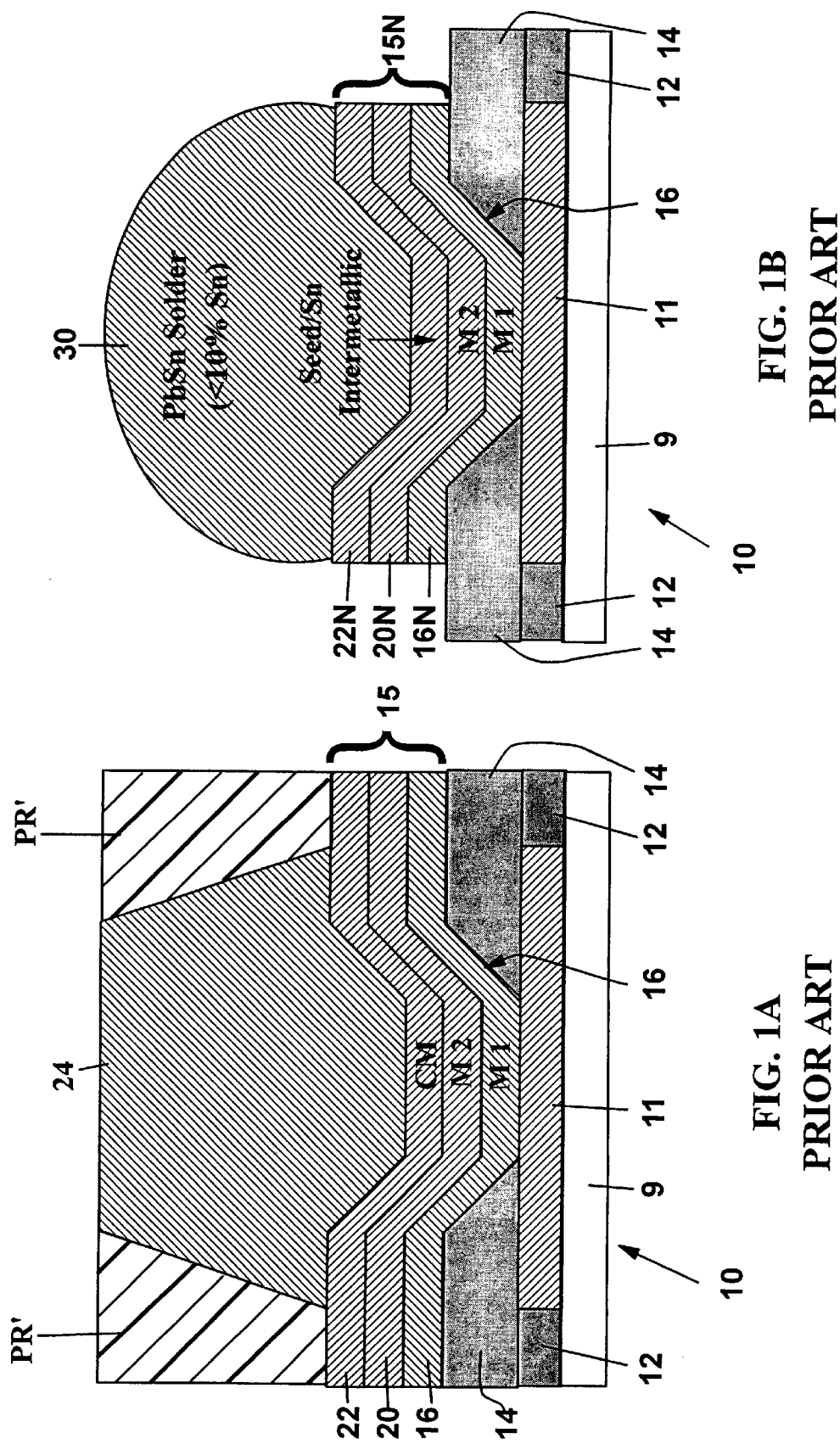
FIGS. 1A and 1B illustrate a prior art process for manufacturing one or more C4 solder bump(s) and forming one or more C4 solder balls therefrom on a conformal, seed layer stack with a copper conductive metal layer on the top surface of the seed layer stack.

The steps of the process of FIGS. 3A–3H are as follows:
1. Referring to FIG. 3A, deposit a multi-layer seed layer stack 15 which includes the conductive metal, surface, CM layer 22, e.g. copper (Cu) (as described in connection with FIG. 1A) over the prepared lower insulation layer 12 reaching down through the VIA opening to connect electrically and mechanically with the electrical contact 11. In particular, the conformal, lower M1, metal, adhesion layer 16 is formed to provide a conformal covering of the upper insulation layer and the electrical contact 11 by reaching down into the tapered VIA opening adhering to the top surface of the electrical contact 11 forming a mechanical and electrical connection thereto. Similarly, the conformal intermediate M2 layer 20 composed of metal is bonded to the lower M1, adhesion layer 16 providing mechanical and electrical connection thereto.

Referring again to FIG. 3A, the metal of the M1 (adhesion) layer 16 is composed of a material such as tungsten (W), titanium tungsten (TiW), or chromium (Cr) and is preferably of uniform thickness.

As shown in FIG. 3A, the intermediate M2 layer 20 can be composed of a material such as an alloy of CrCu, and is also preferably of uniform thickness.

In FIG. 3A the conformal, surface, CM layer 22 is composed of an electrically, highly conductive metal formed over the intermediate M2 layer 20 (as described above in connection with FIG. 1A). The CM layer 22 provides both mechanical and electrical connection to the intermediate M2 layer 20 and to the contact 11 through intermediate M2 layer 20 and the adhesion layer 16. The CM layer 22 can be composed of a material such as copper (Cu), gold (Au), silver (Ag), or platinum (Pt) as the key electrically conductive metal surface component of the seed layer stack 15. In addition, the CM layer 22 is preferably of uniform thickness.

2. Referring to FIG. 3B, deposit a thick-film photoresist PR over the CM layer 22.

Figure 3F:
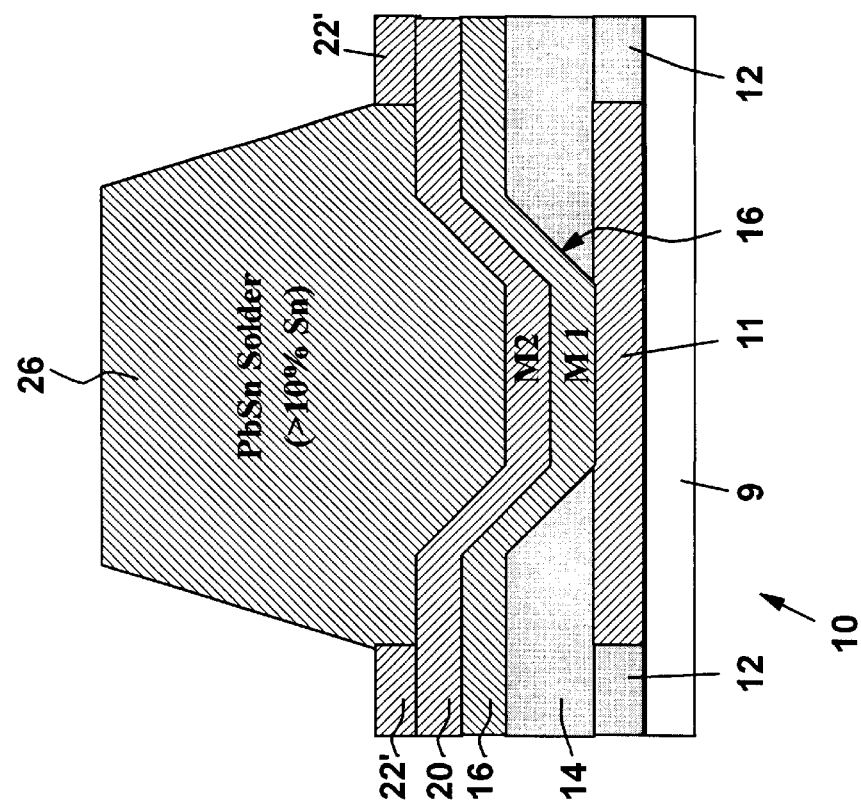
Figure 3E:
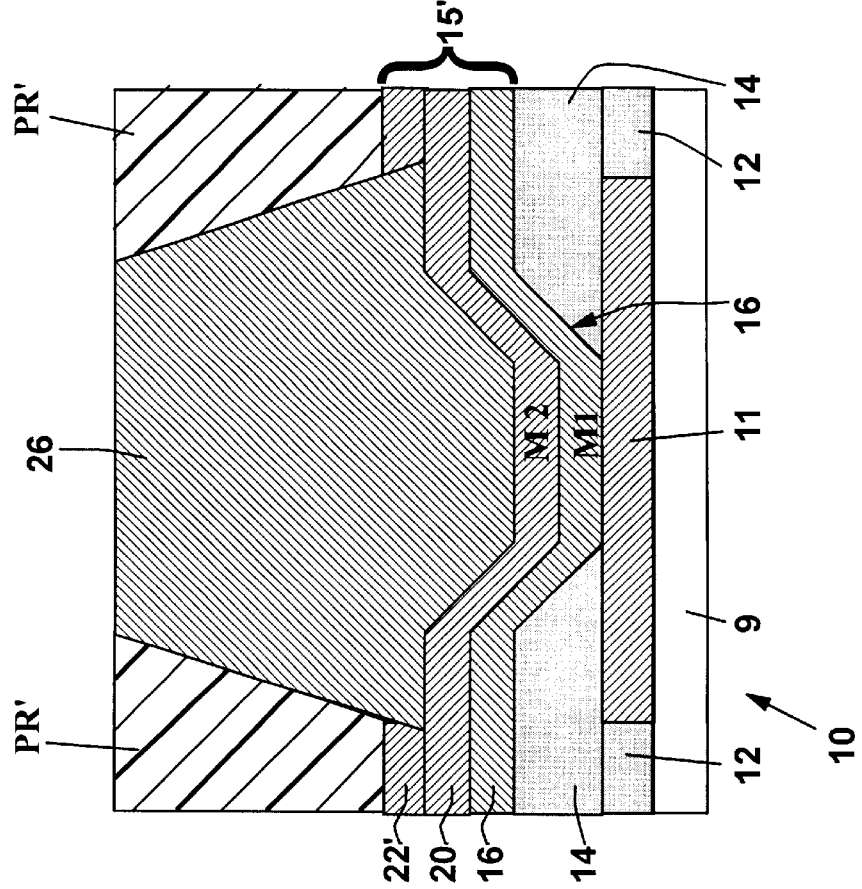
Figure 3H:
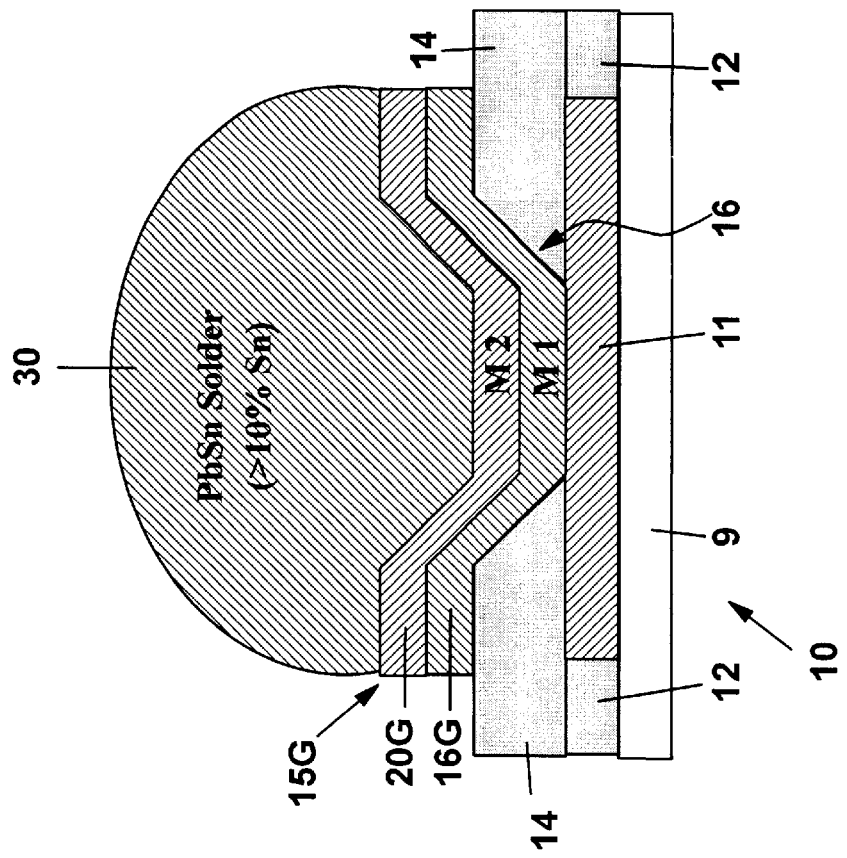

3. Referring to FIG. 3C, expose and develop the photoresist as a photoresist mask PR' to open window(s) 23 (exposing portions of the CM layer 22) as sites for C4 solder bump image(s) that are located where the C4 solder ball(s) 30 are to be formed, such as the C4 solder ball 30 as shown in FIG. 3H 4. Referring to FIG. 3D, remove the exposed portions of the CM layer 22 inside window(s) 23, i.e. the C4 solder bump images, by a subtractive process such as etching and leaving through holes 23' perforating CM layer 22 and reaching down from the window(s) 23 to expose the surface of the M2 layer 20 inside the window(s) 23 through the photoresist mask PR'. The exposed portion of CM layer 22 can be removed from inside photoresist mask PR' to form the through holes 23' at the bottom of window(s) 23 using a number of methods, including but not limited to wet chemical etching, electrolytic dissolution, or dry plasma etching. The through holes 23' in CM layer 22 are aligned with the window(s) 23. By this subtractive step, the seed layer stack 15 is transformed into a patterned seed layer stack 15' and a patterned CM layer 22' with an array of through holes 23' down to M2 layer 20 comprising the C4 solder bump images. The sidewalls of CM layer 22' remains around the periphery of the through holes 23' beneath photoresist mask PR' leaving the top surface of the M2 layer 20 of the patterned seed layer stack 15' exposed. In summary, the patterned seed layer stack 15' provides C4 solder bump sites comprising through holes 23' perforating the CM layer 22' with the top surface of metallic M2 layer 20 exposed at the bottom of hole 23.

5. FIG. 3E illustrates a fully deposited C4 solder bump 26 which has been formed filling both the window 23 in the photoresist mask PR' and the hole 23' and covering the exposed surface of M2 layer 20 and sidewalls of the CM layer 22'. The C4 solder bump(s) 26 was electroplated onto the surface of the M2 layer 20 exposed at the bottom of the through hole 23' and onto the sidewalls of the perforated CM layer 22' at the periphery of the holes 23' by placing the semiconductor device 10 in an electroplating bath. The C4 solder bump 26 is shown filling the through hole(s) 23' and the window(s) 23 up to the top of the photoresist mask PR'. The C4 solder bumps 26 are either high-lead or high-Sn solders with greater than 10 percent tin (Sn). The C4 solder bump 26 can be electroplated into the holes 23' by passing a plating current through the electroplating bath and completing the electrical circuit through the highly conductive perforated CM layer 22' which conducts current to the M1 layer 16 and M2 layer 20 also. Thus, the solder is electroplated onto the exposed sidewall surfaces of the CM layer 22' and the top surface of the intermediate M2 layer at the bottom of the through holes 23', as has been done in the past with a solid CM layer.

EXAMPLE

A eutectic PbSn alloy having the composition 63% Sn, 37% Pb by weight with a thickness of about 100 micrometers can be electroplated from a methane sulfonic acid solution of $Sn^{2+}$ and $Pb^{2+}$ cations. Other plating baths may be employed also. The preferred concentration of the cations is 0.1 to 0.3 moles/liter of $Sn^{2+}$ cations and 0.04 to 0.2 moles/liter of $Pb^{2+}$ cations. The preferred concentration of the methane sulfonic acid is from about 1 to about 2.5 moles/liter. The electroplating is performed at room temperature with a current density from about 20 $mA/cm^2$ to about 100 $mA/cm^2$.

Alternatively, one can employ other solders of tin, copper, silver, and bismuth, such as SnCu, SnBi, SnAg and SnCuAg and other alternatives as will be well understood by those skilled in the art.

6. Referring to FIG. 3F, remove the photoresist mask PR' by chemical dissolution leaving the top surface of the remaining portions of the CM layer 22' exposed.

Figure 3G:
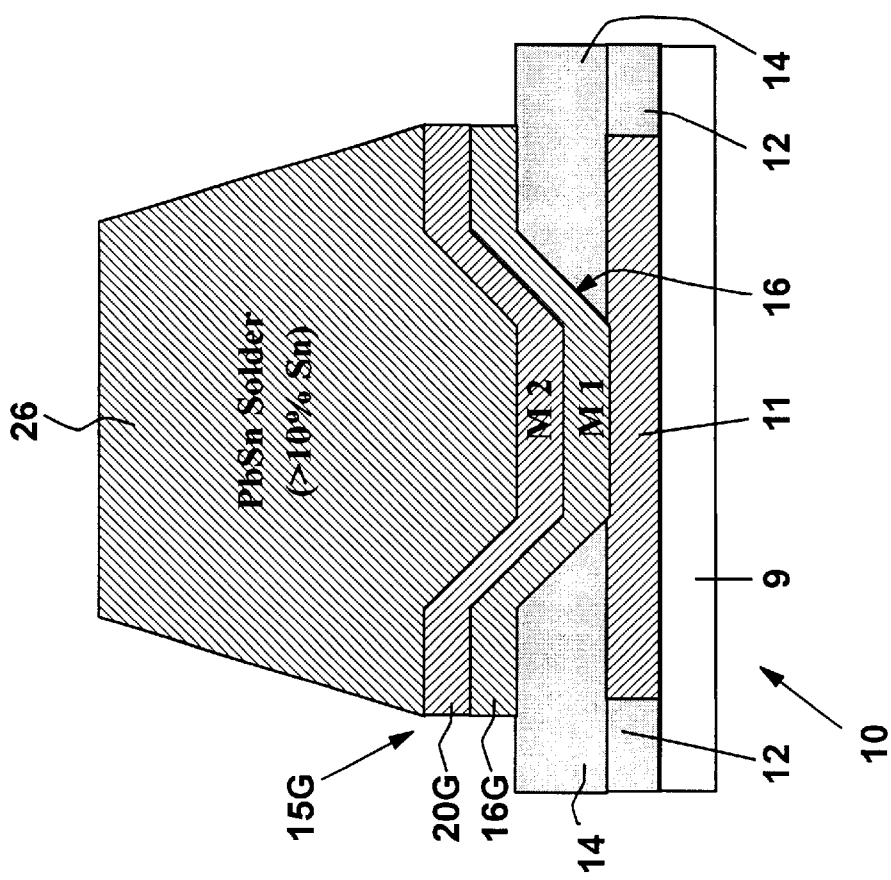

7. Referring to FIG. 3G then next sequence of steps is to perform metal etching techniques to form BLM pads 15G composed of M2 layer 20G and M1 layer 16G from the patterned seed layer stack 15'. The BLM pad 15G is formed by the base of stack 15', i.e. M2 layer 20G and M1 layer 16G minus CM layer 22'. An etching step is performed to remove the peripheral portions of the seed layer stack 15' aside from the solder bump 26 including the remainder of the CM layer 22', and the periphery of the base comprising the M2 layer 20 and M1 layer 16 between the C4 solder bumps 26. Thus, BLM pad 15G is formed beneath the solder bump 26. The remainder of CM layer 22' between the C4 solder bumps 26 (separating the sites for the solder balls 30) has been completely removed. The BLM pad 15G is composed of M2 layer 20G and Ml layer 16G that are self-aligned with the C4 solder bumps 26. The BLM pad 15G is provided to shape the solder bump(s) 26 into the solder ball(s) 30 during the reflow step.

To remove the Cu of the CM layer 22' from the periphery of the C4 solder bump(s) 26 the process employed is either an electroetch consisting of an electrolytic cell containing an electrolytic solution composed of a conductive salt such as potassium sulfate, or a chemical wet etch such as one containing ammonium persulfate that is not harmful to the C4 solder pads. The teachings of U.S. Pat. No. 5,800,726 of Cotte, Datta, Dinan and Shenoy for "Selective Chemical Etching in Microelectronic Fabrication" are incorporated herein by reference.

To remove an alloy such as CrCu of the M2 layer 20 from the periphery of the C4 solder bump(s) 26, electrochemical etching may be used, employing an electrolytic solution consisting of a conductive salt, such as potassium sulfate, or chemical wet etching using a solution containing a chrome etchant, such as potassium sulfate.

In the case of an M1 layer 16 composed of Ti or TiW, a final etchant is preferred which comprises a mixed solution of hydrogen peroxide, EDTA, and potassium sulfate at a temperature of 60° C. as taught in U.S. Pat. No. 5,462,282 of Datta, the teachings of which are incorporated herein by reference. This final etchant is used to remove the Ti or TiW of the adhesion layer 16 from the periphery of the C4 solder bump(s) 26.

8. Referring to FIG. 3H, the final step in the process is to reflow the C4 solder bump(s) 26 to form the C4 solder ball(s) 30 which is self aligned with the BLM pad(s) 15G. FIG. 3H depicts the final C4 ball 30 after the removal of the photoresist mask PR', and reflow. It is clear that the copper CM layer 22' which was completely removed in FIG. 3G is not included in or even near the final BLM pad 15G. Thus, there is no opportunity for peripheral attack of the CM layer 22/22' by a high-Sn solder which has been removed prior to the reflow step.

Second Preferred Embodiment

Figure 4B:
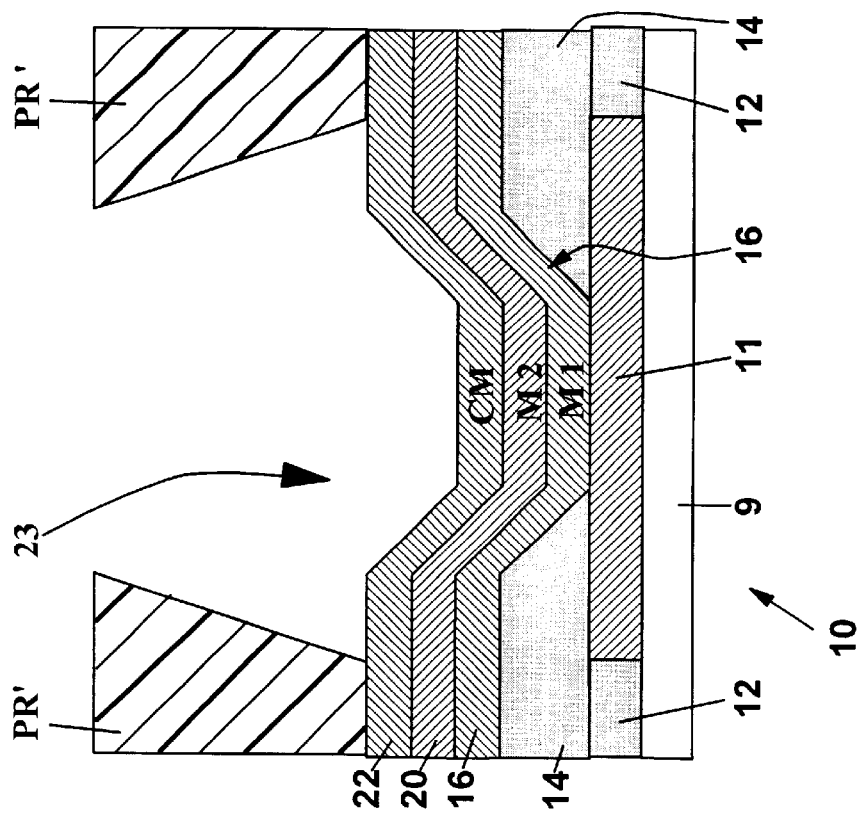
Figure 4A:
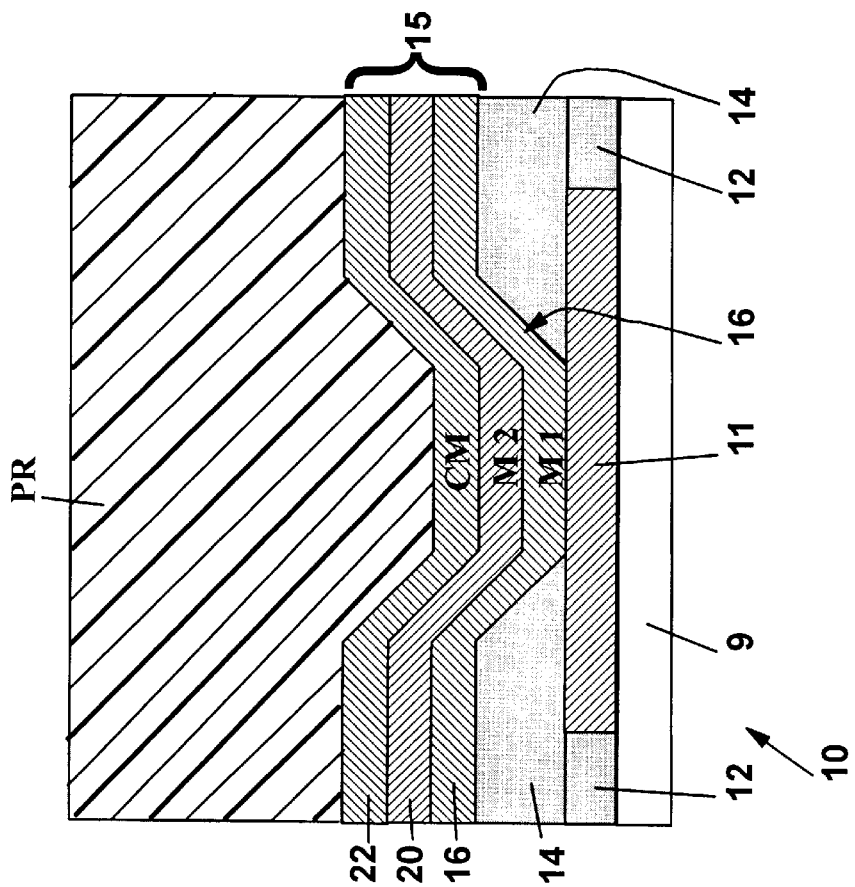

A second embodiment of this invention is implemented by modification of the process of FIGS. 3A–3B by adding a barrier layer or layers between the intermediate M2 layer 20 and the C4 solder bump 26 as illustrated by FIGS. 4A–4H. For example, a barrier layer 28 composed of nickel (Ni) can be electroplated in the through holes 23' as shown in FIG. 4C onto the top surface of intermediate M2 layer 20 into the windows 23 in the photoresist mask PR' in the shape of the through holes 23' at the bottom of the windows 23 (as a base for electroplating of C4 solder bumps 26) after removal of the copper of CM layer 22, but prior to the deposition of the C4 solder bumps 26, as outlined in the following process sequence:

1. Referring to FIG. 4A, deposit a multi-layer seed layer stack 15 as in FIG. 3A, which includes the M1 adhesion layer 16, the intermediate, metallic, M2 layer 20 and the metallic surface, CM layer 22 formed above M2 layer 20, deposited in that order on the contact 11 and dielectric layer 14 as described above.
2. Referring again to FIG. 4A, deposit a blanket thick-film of photoresist PR on top of the CM layer 22.
3. Referring to FIG. 4B, expose and develop the photoresist PR to form a photoresist mask PR' with C4 solder bump images formed by window openings 23 extending through mask PR' above the future location of a C4 solder bump 26 which is to be formed into a C4 solder ball(s) 30 shown in FIG. 4H. The windows 23 in the photoresist mask PR' reach down to the surface of the CM layer 22.
4. Referring to FIG. 4C, remove the exposed portions of the CM layer 22 inside window(s) 23, i.e. the C4 solder bump images, by a subtractive process such as etching and leaving through holes 23' perforating CM layer 22 and reaching down from the window(s) 23 to expose the surface of the M2 layer 20 inside the window(s) 23 through the photoresist mask PR'. The exposed portion of CM layer 22 can be removed from inside photoresist mask PR' to form the through holes 23' at the bottom of window(s) 23 using a number of methods, including but not limited to wet chemical etching, electrolytic dissolution, or dry plasma etching. The through holes 23' in CM layer 22 are aligned with the window(s) 23. By this subtractive step, the seed layer stack 15 is transformed into a patterned seed layer stack 15 and a patterned CM layer 22' with an array of through holes 23' down to M2 layer 20 comprising the C4 solder bump images. The sidewalls of CM layer 22' remain around the periphery of the through holes 23' beneath photoresist mask PR' leaving the top surface of the M2 layer 20 of the patterned seed layer stack 15' exposed. As in FIG. 3D, the exposed sidewalls of the CM layer 22' surround the periphery of the opening 23'.
5. Referring to FIG. 4D, deposit a barrier layer(s) 28 over the exposed surfaces of the seed layer structure 15' including layer M2 and the sidwalls of CM layer 22' by an electrolytic process. The barrier layer 28 is shown to be equal to the thickness of the CM layer 22' covering the exposed surfaces thereof, but it may be either thicker or thinner, as required. The barrier layer(s) 28 is (are) composed of a metal such as nickel (Ni), which is deposited onto the top surface of the M2 layer 20 between the sidewalls of the metallic surface of CM layer 22 which remain under the photoresist mask PR' forming a modified window/opening 23" for patterning the C4 solder bumps 26 in FIG. 4E.

Alternative barrier layer 28 materials include nickel iron (NiFe), nickel phosphorus (NiP), cobalt (Co) and cobalt phosphorus (CoP) among other metals which impede the diffusion of tin(Sn) as will be well understood by those skilled in the art.

Figure 4H:
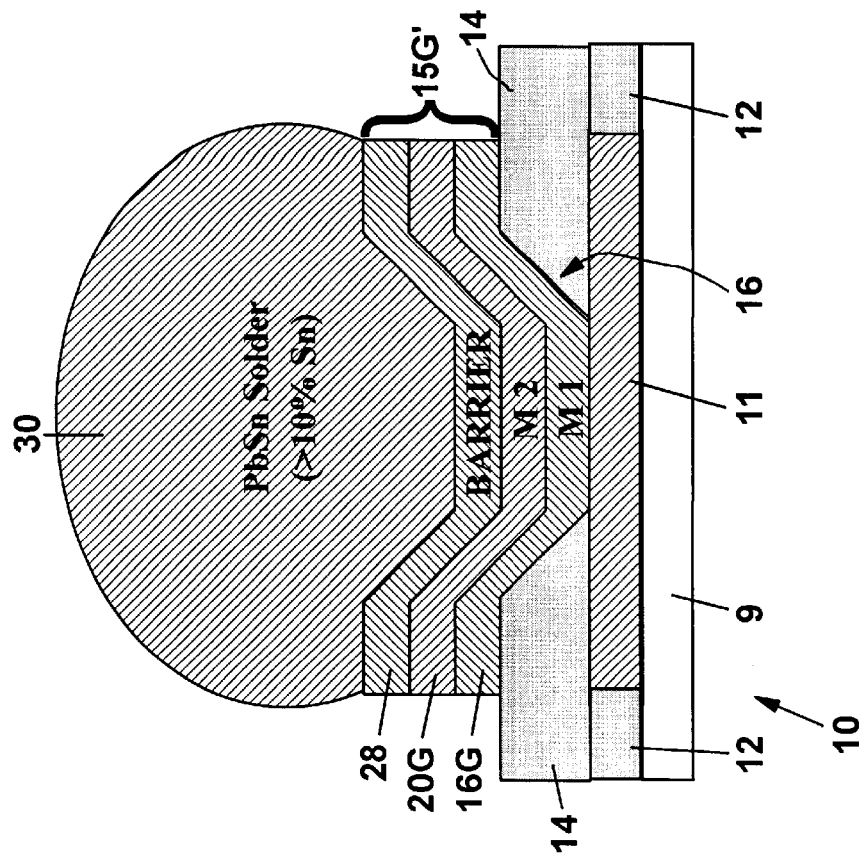
Figure 4G:
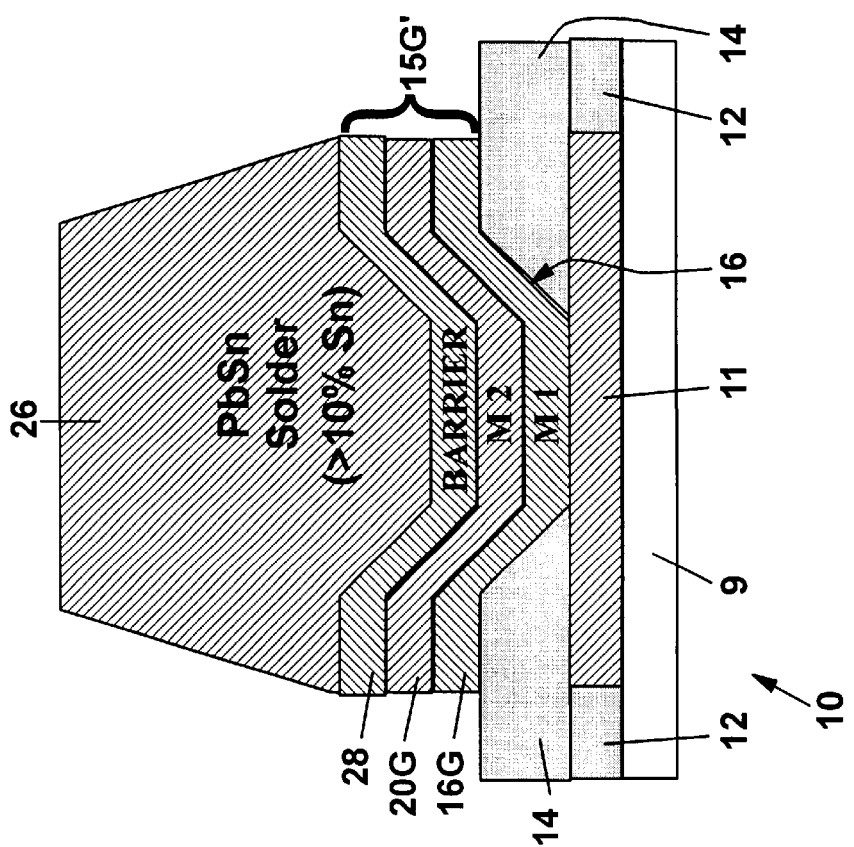

6. Referring to FIG. 4E, electroplate C4 solder bumps 26 onto the surface of the barrier layer 28 within the window/opening 23". The barrier layer 28 is composed of either a high-lead solder or a high-Sn solder with a tin content greater than 10 percent.
7. Referring to FIG. 4F remove the photoresist mask PR' by chemical dissolution.
8. Referring to FIG. 4G device 10 is shown after removal of the remainder of the CM layer 22' and the peripheral portions of the base layers 20/16, i.e. M2 layer 20 and M1 layer 16, between the C4 solder bumps 26 by metal etching techniques, as described above thereby forming the BLM pad 15G' which differs from the BLM pad 15G of FIGS. 3G and 3H by the inclusion of the additional barrier layer 28 portion of the BLM pad 15G above the M2 pad layer 20G.
9. Referring to FIG. 4H reflow the C4 solder bumps 26 to form the C4 solder balls 30 above the BLM pad 15G'.

This invention has been demonstrated on prototypes, using a BLM adhesion layer 16 of TiW an intermediate BLM layer 20 of CrCu and a seed layer 22 of Cu with both nickel (Ni) and NiFe barrier layers 28. Following the methodology outlined above, the resist was patterned, and the copper was etched out at the base of the holes using an ammonium persulfate solution. Lead-tin (PbSn) solders were then successfully deposited both with and without a Ni or NiFe barrier layer 28. Tests revealed that the remaining metallurgy underneath the C4 solder balls 30 did not contain copper.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a solder structure on a substrate comprising:

starting with contacts exposed through an insulating layer and forming a base over the contacts, with the base having a top surface and being composed of at least one metal layer, forming a conductive metal layer, with an upper surface, over the top surface of the base, forming a mask over the top surface of the base, with the mask having C4 solder bump openings therethrough in the shape of C4 solder bump images down to the upper surface of the conductive metal layer above the contacts, etching away the exposed portions of the conductive metal layer below the C4 solder bump openings forming through holes, with sidewalls, on the conductive metal layer down to the top surface of the base, thereby forming C4 solder bump plating sites on the top surface of the base, with the conductive metal layer remaining intact aside from the through holes, depositing solder over the base to form C4 solder bumps filling the C4 solder bump plating sites within the C4 solder bump openings and through the sidewalls thereof to plate the solder in the solder bump openings, then removing the mask, then etching away the remainder of the conductive metal layer, and then etching away the base aside from the C4 solder bumps thereby forming Ball Limiting Metallurgy (BLM) pads which are plated with the C4 solder bumps.

2. The method of claim 1 including forming the C4 solder bumps into C4 solder balls above the BLM pads.

3. The method of claim 1 including forming an intermediate metal layer above the one metal layer before forming the conductive metal layer.

4. The method of claim 1 including:
forming an intermediate metal layer above the one metal layer before forming the conductive metal layer, and
reflowing the C4 solder bumps to form C4 solder balls over the BLM pads.

5. The method of claim 1 including performing the step of filling the C4 solder bump openings with a barrier layer over the base, after etching away the exposed portions of the conductive metal layer below the C4 solder bump openings and before electroplating solder over the base to form C4 solder bumps.

6. The method of claim 1 including depositing the C4 solder bumps by providing an electroplating current through the conductive metal layer and through the sidewalls thereof to plate the solder in the solder bump openings with the C4 solder bumps being in contact with the conductive metal layer on the periphery of the through holes by providing an electroplating current passing through the conductive metal layer and through the sidewalls thereof to plate the solder in the solder bump openings.

7. The method of claim 1 including the conductive metal layer being formed by at least one of the metals selected from the group consisting of copper, gold, silver and platinum.

8. The method of claim 1 including forming an intermediate layer of metal above the one metal layer before forming the conductive metal layer.

9. A method of forming a solder ball on a substrate comprising:
starting with contacts exposed through an insulating layer and forming a base over the contacts, with the base having a top surface and being composed of at least one metal layer, forming a conductive metal layer with an upper surface over the base, forming a mask over the top surface of the conductive metal layer with C4 solder bump openings therethrough in the form of windows in the shape of C4 solder bump images down to the surface of the conductive metal layer above the contacts, etching away the exposed portions of the conductive metal layer below the C4 solder bump openings, thereby forming through holes, with sidewalls, in the conductive metal layer exposing C4 solder bump plating sites on the top surface of the base below the C4 solder bump openings with the conductive metal layer remaining intact on the periphery of the through holes at the C4 solder bump plating sites, plating solder onto the top surface of the base at the C4 solder bump plating sites filling the C4 solder bump openings by providing an electroplating current through the conductive metal layer and through the sidewalls thereof to plate the solder in the solder bump openings with the C4 solder bumps being in contact with the conductive metal layer on the periphery of the through holes by providing an electroplating current passing through the conductive metal layer and through the sidewalls thereof to plate the solder in the solder bump openings, depositing solder over the base to form C4 solder bumps filling the C4 solder bump plating sites within the C4 solder bump openings and through the sidewalls thereof to plate the solder in the solder bump openings, removing the mask, and then etching away the base aside from the C4 solder bumps thereby forming Ball Limiting Metallurgy (BLM) pads which are plated with the C4 solder bumps.

10. The method of claim 9 including reflowing the C4 solder bumps to form a solder balls therefrom over the remaining base regions after the step of etching away the base aside from the C4 solder bumps leaving remaining base regions self-aligned with the C4 solder bumps.

11. The method of claim 9 including forming another metal layer above the adhesion metal layer before forming the conductive metal layer.

12. The method of claim 9 including:
forming an intermediate layer above the adhesion metal layer before forming the conductive metal layer,
reflowing the C4 solder bumps to form a solder balls over the BLM pads.

13. The method of claim 9 including depositing solder to form C4 solder bumps on the top surface of the base at the C4 solder bump plating sites filling the C4 solder bump openings by providing an electroplating current through the conductive metal layer and through the sidewalls thereof to plate the solder in the solder bump openings with the C4 solder bumps being in contact with the conductive metal layer on the periphery of the through holes by providing an electroplating current passing through the conductive metal layer and through the sidewalls thereof to plate the solder in the solder bump openings.

14. The method of claim 9 including the conductive metal layer being formed by at least one of the metals selected from the group consisting of copper (Cu), gold (Au), silver (Ag), and platinum (Pt).

15. A method of forming a solder ball on a substrate comprising:
starting with contacts exposed through an insulating layer and forming a base over the contacts, with the base having a top surface and being composed of at least one metal layer, forming a conductive metal layer with a upper surface over the base, forming a mask over the top surface of the conductive metal layer with C4 solder bump openings therethrough in the form of windows in the shape of C4 solder bump images down to the surface of the conductive metal layer above the contacts, etching away the exposed portions of the conductive metal layer below the C4 solder bump openings, thereby forming through holes, with sidewalls, in the conductive metal layer exposing C4 solder bump plating sites on the top surface of the base below the C4 solder bump openings with the conductive metal layer remaining intact on the periphery of the through holes at the C4 solder bump plating sites, depositing a barrier layer with a barrier surface over the top surface of the base, plating solder onto the barrier surface at the C4 solder bump plating sites filling the C4 solder bump openings by providing an electroplating current through the conductive metal layer and through the sidewalls thereof to plate the solder in the solder bump openings with the C4 solder bumps being in contact with the conductive metal layer on the periphery of the through holes by providing an electroplating current passing through the conductive metal layer and through the sidewalls thereof to plate the solder in the solder bump openings, depositing solder over the base to form C4 solder bumps filling the C4 solder bump plating sites within the C4 solder bump openings and through the sidewalls thereof to plate the solder in the solder bump openings, removing the mask, and then etching away the base aside from the C4 solder bumps thereby forming Ball Limiting Metallurgy (BLM) pads on which C4 solder bumps have been formed.

16. The method of claim 15 including the step of forming the C4 solder bumps into C4 solder balls above the BLM pads.

17. The method of claim 15 including:

the conductive metal layer being formed by at least one of the metals selected from the group consisting of copper (Cu), gold (Au), silver (Ag), and platinum (Pt), the adhesion layer being composed of a material selected from the group consisting of tungsten and titanium/tungsten (TiW), the intermediate layer being composed of CrCu, and the barrier layer being composed of a material selected from the group consisting of nickel (Ni), nickel iron (NiFe) alloy, nickel phosphorus (NiP) alloy, cobalt (Co), and cobalt phosphorus (CoP) alloy.

18. The method of claim 15 including depositing solder to form C4 solder bumps on the barrier surface of the barrier layer filling the C4 solder bump openings by providing an electroplating current through the conductive metal layer and through the sidewalls thereof to plate the solder in the solder bump openings with the C4 solder bumps being in contact with the conductive metal layer on the periphery of the through holes by providing an electroplating current passing through the conductive metal layer and through the sidewalls thereof to plate the solder in the solder bump openings.

19. The method of claim 15 including the conductive metal layer being formed by at least one of the metals selected from the group consisting of copper (Cu), gold (Au), silver (Ag), and platinum (Pt).

20. The method of claim 15 including:

the conductive metal layer being formed by at least one of the metals selected from the group consisting of copper (Cu), gold (Au), silver (Ag), and platinum (Pt), the adhesion layer being composed of a material selected from the group consisting of tungsten and titanium/tungsten (TiW), and the intermediate layer being composed of CrCu.

* * * * *